US006434244B1

(12) United States Patent
Roberts et al.

(10) Patent No.: US 6,434,244 B1
(45) Date of Patent: Aug. 13, 2002

(54) ELECTROACOUSTIC CONVERTER

(75) Inventors: Allan J. Roberts, Poughquag, NY (US); James F. Sheehan, Warren, CT (US)

(73) Assignee: Branson Ultrasonics Corporation, Danbury, CT (US)

( * ) Notice: Subject to any disclaimer, the term of this patent is extended or adjusted under 35 U.S.C. 154(b) by 0 days.

(21) Appl. No.: 09/558,723

(22) Filed: Apr. 26, 2000

(51) Int. Cl.[7] .......................... H04R 25/00; H01L 41/06
(52) U.S. Cl. .................................. 381/190; 310/323.01
(58) Field of Search ................................ 310/323, 325, 310/323.12, 323.18, 323.01

(56) References Cited

U.S. PATENT DOCUMENTS 3,328,610 A * 6/1967 Jacke et al. ................. 310/325
3,368,085 A * 2/1968 McMaster et al. .......... 310/325
3,524,085 A * 8/1970 Shoh .......................... 310/325
3,555,297 A * 1/1971 Pierson ....................... 310/325
3,694,675 A * 9/1972 Loveday ..................... 310/325
5,371,429 A * 12/1994 Manna ....................... 310/323
5,590,866 A * 1/1997 Cunningham ............... 310/323
5,793,148 A * 8/1998 Rabe .......................... 310/323
5,798,599 A * 8/1998 Harwood .................... 310/325

* cited by examiner

*Primary Examiner*—Curtis Kuntz
*Assistant Examiner*—P. Dabney
(74) *Attorney, Agent, or Firm*—Harness, Dickey & Pierce, P.L.C.

(57) ABSTRACT

An electroacoustic converter is disclosed for converting electrical energy into mechanical vibrations at a predetermined frequency. The converter is supplied with alternating electrical power from a power supply. The converter has a metal front driver mass, a metal back driver mass, a front ceramic stack, a back ceramic stack, a spacer between said front and back ceramic stacks, and a fastener extending axially of the converter coupling the front and back drivers masses to clamp the ceramic stacks and the spacer between the front and back drivers. The front and back ceramic stacks are of a suitable piezoelectric ceramic material such that when energized with alternating electrical power from the power supply the piezoelectric material renders the converter resonant at the predetermined frequency. The spacer, back driver, and front driver masses are provided with fins to radiate heat from the converter. The converter exhibits substantially even temperatures and a vibrational node within the spacer.

17 Claims, 4 Drawing Sheets

ELECTROACOUSTIC CONVERTER

BACKGROUND OF THE INVENTION

This invention relates to electroacoustic converters and ferried transducers, such as used in ultrasonic devices, such as ultrasonic welders for the welding of thermoplastic or other materials. More specifically, this invention concerns improvements in the construction of a clamped transducer or converter utilizing a plurality of piezoelectric wavers clamped between two masses.

A typical one-half wavelength electroacoustic converter is disclosed in the co-assigned U.S. Pat. No. 5,590,866, and is shown in FIG. 1. This prior art electroacoustic converter C has a stack of piezoelectric ceramic wafers W clamped between front and back metal driver masses FM and BM. The piezoelectric materials may be a lead zirconate titante material and are oftentimes referred to as ceramic material. The piezoelectric wafers used in such transducers have a hole at their centers and their diametrical faces may be coated with an electrically conductive material (e.g., silver) to provide suitable electrical contact between the wafers. The piezoelectric wafers are energized with alternating electrical voltage from a suitable power supply and, when energized, the piezoelectric wafers mechanically vibrate. More specifically, as an alternating voltage is applied to the radially polarized piezoelectric wafers, the diameter of each disk or wafer alternatingly increases and decreases in response to the applied voltage. As a result of such diametrical changes, the thickness of the wafer also alternatingly mechanically increases and decreases which manifests itself as longitudinal vibrations. As the wafers vibrate, they in turn apply longitudinal mechanical vibrations to the front driver mass which may be coupled to a suitable horn or other ultrasonic tool for performing the desired work (e.g., the welding of thermoplastic workpieces). In a typical industrial apparatus employing such transducers, the predetermined frequency is typically, but not necessarily, in the ultrasonic range of, for example, 20 kHz., however, such frequencies can vary widely (e.g., between 1–100 kHz) depending on the application. Typically, the peak-to-peak longitudinal excursion of such vibrations is quite small, in the range of approximately 0.001 inches at 20 kHz, but can be increased by coupling the transducer to a suitably shaped horn.

Such devices convert high frequency electrical energy supplied by a suitable power supply into mechanical vibrations. The transducers have an output end to which an intermediate coupler (also oftentimes referred to as a booster horn) is generally attached, for receiving the vibrations from the converter and coupling the vibrations at the same or increased amplitude to an output horn, tool, sonotrode or the like which in turn couples the vibrations to a workpiece. Such half wavelength transducers often have a mounting flange located in a nodal area of the transducer where the vibrations are primarily in the radial direction.

Generally, most of the prior art converters based on the design shown in FIG. 1 have worked well for their intended purposes and have been designed to operate at various predetermined frequencies and power levels. However, certain limitations or shortcomings of such prior art converters have been widely known.

In general, the piezoelectric ceramic wafers and the metal components of the prior art converters have certain geometric shapes and these components have certain vibrational wave velocity properties. The planer stresses generated within these components while undergoing mechanical vibrations (as when the converter is resonant) and the velocity of these vibrations within the various components is not linear. This leads to certain problems or limitations with the prior art converter designs.

Typically, in order to achieve more power from the converter, the converters are designed for increased electrical capacitance. For any given voltage applied to the active elements of the converter (i.e., the piezoelectric wafers) to produce power, an electrical current is required. The current must be conducted through the capacitive branch of the circuit and results in a voltage rise across the piezoelectric wafers. In order to keep this voltage within permissible values and in order to increase the power of the transducer, more piezoelectric ceramic volume is needed. Typically, and as shown in FIG. 1, several pairs of piezoelectric ceramic wafers W are placed in parallel with one another so as to increase the total capacitance of the converter.

However, the increased volumes of ceramic material needed to achieve such higher power levels leads to problems. Typically, such designs use three pairs of ceramics wafers (as seen in FIG. 6) in order to produce the required higher power levels. This results in a larger volume of ceramic material relative to the volume (mass) of the converter as a whole. This larger volume or mass for the converter may result in the vibrational node for the converter not being located at desired location (typically within the mounting flange F, as shown in FIG. 1), but may be located within the ceramic wafers W. This results in unwanted motion and leads to lost energy.

In such prior art transducer designs, the ceramic wafers are driven in parallel. Since these prior art designs are so-called distributed designs, the equivalent motional voltages required to drive each pair of ceramic wafers may differ. This leads to unwanted circulating currents, electrical losses, and unequal power contributions for each pair of ceramic wafers.

Still further, as the frequency and stress within the ceramic wafers change, the location of the node point within the transducer will change and thus how the mechanical load is reflected back into the ceramics will change also. This changing condition makes the converter more unpredictable in its electrical impedance characteristics.

As is typical with any electromechanical transducer, the conversion of electrical power into mechanical energy (vibrations) generates heat within the transducer. The thermal resistance or thermal conductance of the ceramic components of the transducer is higher than that of the metal components. An increase in the volume of the ceramic components leads to areas within the transducer of high thermal concentrations and most of the heat transfer within the transducer takes place by conduction from the ceramic components to the metal components (primarily the front and back driver masses). Increased temperature of the ceramic components reduces their efficiency in converting electrical energy into mechanical energy.

Still further, if the volume of the ceramics is increased to result in higher desired power levels or to compensate for losses, the physical dimensions of the converter change, yet the converter dimensions are limited by the desired operating frequency. Thus, there must be a balance between the amount of ceramic material which can be provided to compensate for losses and the mechanical dimension of the converter.

It should also be recognized that there are mechanical losses in the ceramic material and in the mechanical structure for the converter. These losses occur at the operating fundamental frequency of the converter and sometime at harmonic frequencies of the fundamental frequency. In many prior designs, it is not unusual to excite third harmonic motions within the converter. These third harmonics typically occur in the mounting flange or in the back driver of the converter. Such harmonic motions produce no useful work and contribute to localized losses and temperature increases.

SUMMARY OF THE INVENTION

Among the several objects and features of the present invention may be noted the provision of an electroacoustic converter in which the electrical and mechanical characteristics of the converter are more stable and are less influenced by variations in operating conditions of the converter;

The provision of such an electroacoustic converter which produces higher power than prior converters of similar size;

The provision of such an electroacoustic converter in which the internal losses are reduced;

The provision of such an electroacoustic converter which is better controlled than prior converters;

The provision of such an electroacoustic converter in which heat losses are better dissipated in order to reduce the operating temperature of the ceramic components of the converter to increase the operating efficiency of the converter;

The provision of such an electroacoustic converter in which stress distribution and stress gradients within the ceramic components are low and in which parasitic frequencies are also low;

The provision of such an electroacoustic converter in which, because the stresses in the ceramic materials are better controlled and are lower, the converter may be of larger diameter (as compared to prior converter designs) thus allowing the use of more ceramic volume which in turn increases the power provided by the converter;

The provision of such an electroacoustic converter in which the ceramics are symmetrically arranged in the converter with respect to a vibrational node such that the front and back ceramic components generate substantially equal power and such that the motional voltages applied to the front and back ceramic components are substantially equal to reduce circulating currents and resulting losses.

The provision of such an electroacoustic converter in which, since the design is substantially symmetric and stress is more controlled, reflection of the tooling (which is typically operatively coupled to the front driver of the converter) back to the terminals is more defined and stable thus allowing a wider range of tooling stacks of various designs;

The provision of such an electroacoustic converter in which the cross sectional area of metal components (front driver, back driver, center section) in contact with the ceramics is increased thus resulting in a greater rate of heat transfer.

The provision of such an electroacoustic converter in which a metal spacer positioned between the front and back sets of ceramic components more effectively transfers heat from the ceramic components;

The provision of such an electroacoustic converter which employs a somewhat lower ceramic volume but which generates appreciably higher average power than comparable prior art transducer designs; and The provision of such an electroacoustic converter which is of an economical design, which is of a cost efficient design, which has a long service life, and which more efficiently converts electrical energy into mechanical vibrations.

Other objects and features of this invention will be in part apparent and in part pointed out hereinafter.

Briefly stated, an electroacoustic converter (transducer) of the present invention converts electrical energy into mechanical vibrations within a predetermined frequency range (e.g., ranging between about 16–100 kHz.). The converter is supplied with alternating electrical power (voltage) from a suitable power supply. The converter comprises a metal front driver mass, a metal back driver mass, a front ceramic stack, a back ceramic stack, a spacer between the front and back ceramic stacks, and a fastener coupled to the front and back driver masses for clamping the ceramic stacks and the spacer between the front and back drivers. The front and back ceramic stacks are of a suitable piezoelectric ceramic material which, when energized with alternating electrical power of predetermined frequency from the power supply that the converter is rendered resonant to vibrate in axial direction. The spacer and back driver mass are provided with fins to convect heat away from the converter to transfer the heat to ambient.

BRIEF DESCRIPTION OF THE DRAWINGS

Corresponding reference characters indicate corresponding parts throughout the several views of the drawings.

DESCRIPTION OF PREFERRED EMBODIMENTS

Figure 2:
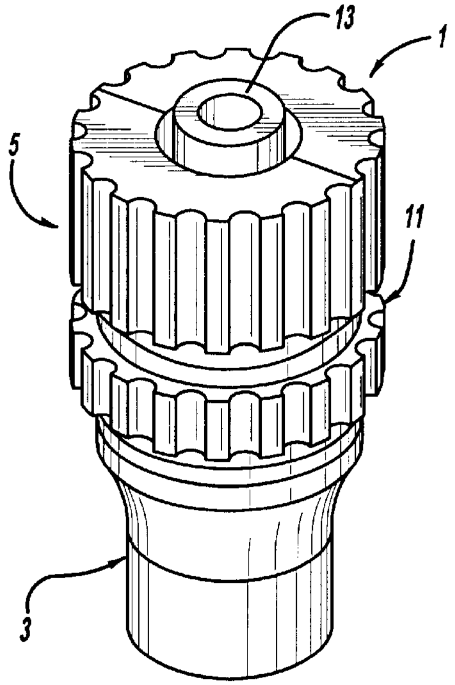
FIG. 2 is a perspective view of the electroacoustic converter of the present invention illustrating the major components of the converter.
Figure 3:
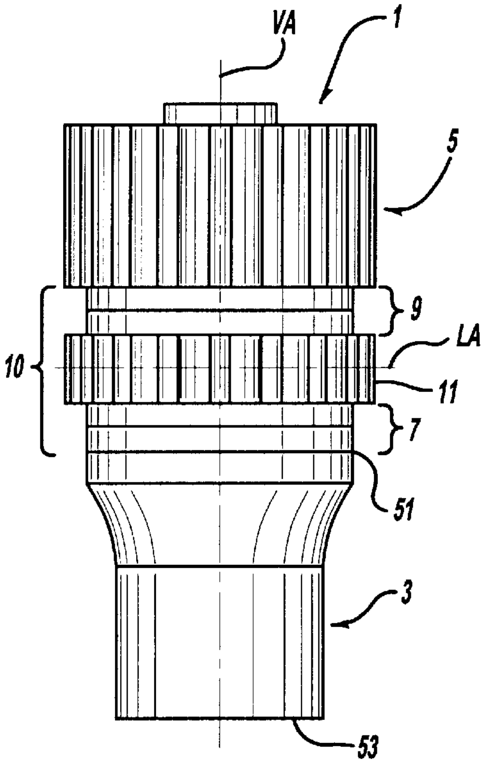
FIG. 3 is an elevational view of the electroacoustic converter of the present invention.

An electroacoustic converter 1 of the present invention is shown generally in FIGS. 2 and 3. The converter 1 converts electrical energy into mechanical vibrations at a predetermined frequency. It includes generally circular in cross-section, and includes a longitudinal or vertical axis VA.

The converter 1 includes a metal front driver mass 3, a metal back driver mass 5, a front ceramic stack 7, a back ceramic stack 9, and a spacer 11 positioned between the front and back ceramic stacks. A fastener 13 (similar to the bolt B of FIG. 1) extends axially through the back driver 5, the ceramic stacks 7 and 9, and into the front driver 3 to clamp the ceramic stacks 7 and 9 and the spacer 11 between the front and back drivers 3 and 5. As seen in FIG. 2, the ceramic stacks 7 and 9 are substantially symmetrical about the spacer 11, and the ceramic stack/spacer assembly 10 is substantially symmetrical about a lateral axis LA. Each ceramic stack has two ceramic wafers W. The number of wafers in the front and back ceramic stacks could be any number, depending on the thickness of the ceramic wafers, the operating ½ wavelength frequency, and whether or not the center section is left electrically positive or negative. Preferably, the converter 1 is dimensioned to form a complete half wavelength resonator at the predetermined frequency which has a vibration node of the longitudinal vibrations located within the spacer 11, and preferably approximately at the lateral axis LA.

Figure 7:
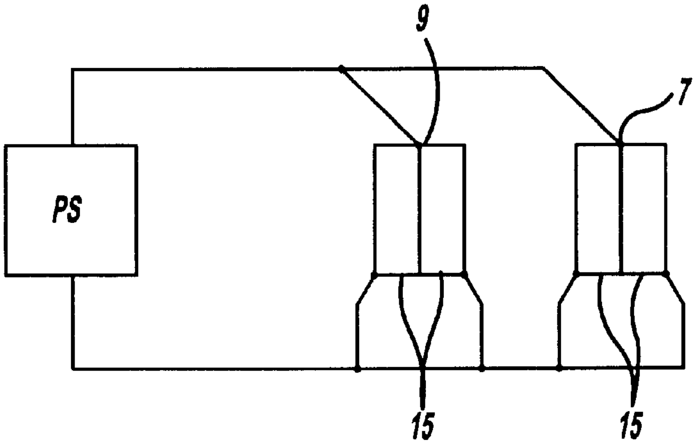
FIG. 7 is an electrical schematic of the transducer of the present invention as it is supplied electrical power by a suitable power supply.

The front and back ceramic stacks 7 and 9, as noted above, are separated by the spacer 11. This puts amplitude gain in the system. The ceramic wafers W in stacks 7 and 9 are made of a suitable piezoelectric ceramic material, such as lead zirconate titante, such that when energized with alternating electrical power the converter is rendered resonant for vibrations along the longitudinal axis A. Preferably, the ceramic stacks 7 and 9 are each made of a pair of wafers 15. The wafers 15 of each ceramic stack are substantially similar in size and shape and in electrical and mechanical characteristics so that the stacks will be substantially symmetric. As seen in FIG. 7, the wafers 15 are connected in parallel to the power supply PS, which, when activated, will energize the wafers 15. For example, power supply PS could be a model 930 commercially available from Branson Ultrasonics Corporation of Danbury, Conn. The wafers could, if desired, be connected in series to the power supply. The wafers are preferably coated with a conductive layer, for example, of silver, so that the wafers 15 of each pair of wafers, will be in electrical contact with each other.

Figure 4:
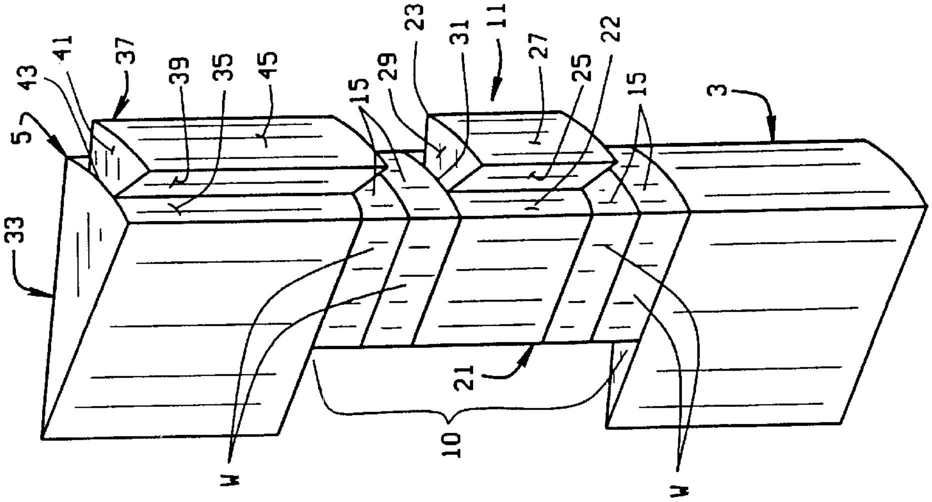
FIG. 4 is a perspective sectional view of the converter.

Referring to FIG. 4, the spacer 11 is a metal spacer, preferably made of aluminum. It includes a body 21 having an outer surface 22. The spacer body 21 has a diameter substantially equal to the diameter of the ceramic stacks 7 and 9. The spacer 21 includes fins 23 radiating outwardly from the spacer body. The fins 23 extend axially the full height of the spacer 11. As best seen in FIG. 4, the spacer fins 23 have side surfaces 25 and an outer surface 27. The side surfaces 25 are shown in the figure to angle outwardly relative to a radius of the spacer 11 such that the top and bottom surfaces 29 of the fins 23 are generally trapezoidal in shape, with the base 31 of the fins 23 having a smaller dimension than the outer surfaces 27 of the fins. In actual designs these fins will have a shape similar to that shown in FIG. 8. This design allows the use of a ball mill in machining the fins. Alternatively, these components could be made of extruded aluminum and could have other radial fin profiles.

Figure 8:
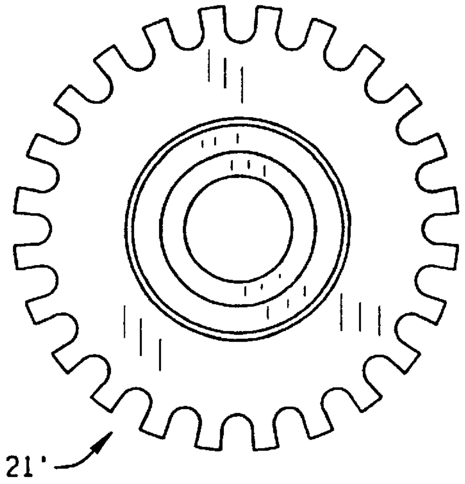
FIG. 8 is an end view of a spacer having an alternate fin profile.

The back driver mass 5 includes a body 33 having an outer surface 35. The body 33 has a diameter (measured to the outer surface 35) substantially equal to the diameter of the ceramic stacks 7 and 9. Like the spacer 21, the back driver mass 5 also includes fins 37 radiating outwardly from outer surface of the driver mass 5. The fins 37 extend axially the full height of the driver mass 5. As best seen in FIG. 4, the driver mass fins 37 are shaped substantially similarly to the spacer fins 23. The side surfaces 39 of the driver mass fins 37 angle outwardly relative to a radius of the driver mass 5 such that the top and bottom surfaces 41 of the fins 37 are generally trapezoidal in shape, with the base 43 of the fins 37 having a smaller dimension than the outer surfaces 45 of the fins. In one embodiment of this invention, the configuration of the fins may be as shown in FIG. 8. As seen in FIGS. 2 and 3, when the converter is assembled, the spacer fins 23 are preferably (but not necessarily) substantially aligned with the back mass driver fins 37.

Figure 9A:
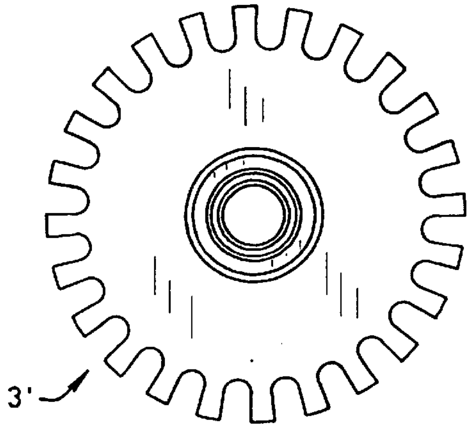
FIGS. 9A and 9B are end and side elevational views of an alternate design for the front driver mass having a different fin profile from that shown in FIGS. 2 and 3.
Figure 9B:
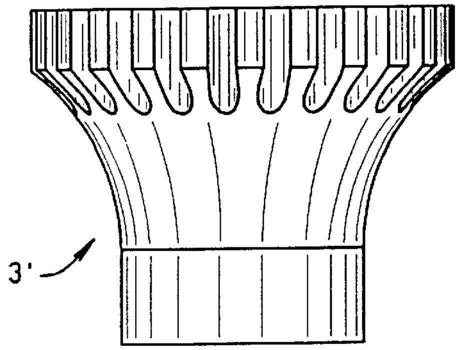

The front driver mass 3 is generally circular in cross-section and has a back end 51, a front end 53, and an outer surface. The front driver mass 3, to which the horn is fixed, preferably has a smooth outer surface, as seen in FIG. 2 (i.e., the front driver mass is not provided with fins). However, in some designs, it may be desirable to add fins to the front driver, as shown in FIGS. 9A and 9B.

The front driver mass 3 has a diameter at its back end 51 substantially equal to the diameter of the ceramic stacks. The diameter of the front driver 3 can be substantially constant (in which case, the driver 3 would be generally cylindrical) or, the front driver 3 can have a reduced cross-sectional area (as seen in FIG. 3) to increase the vibrational amplitude of the converter.

Figure 5:
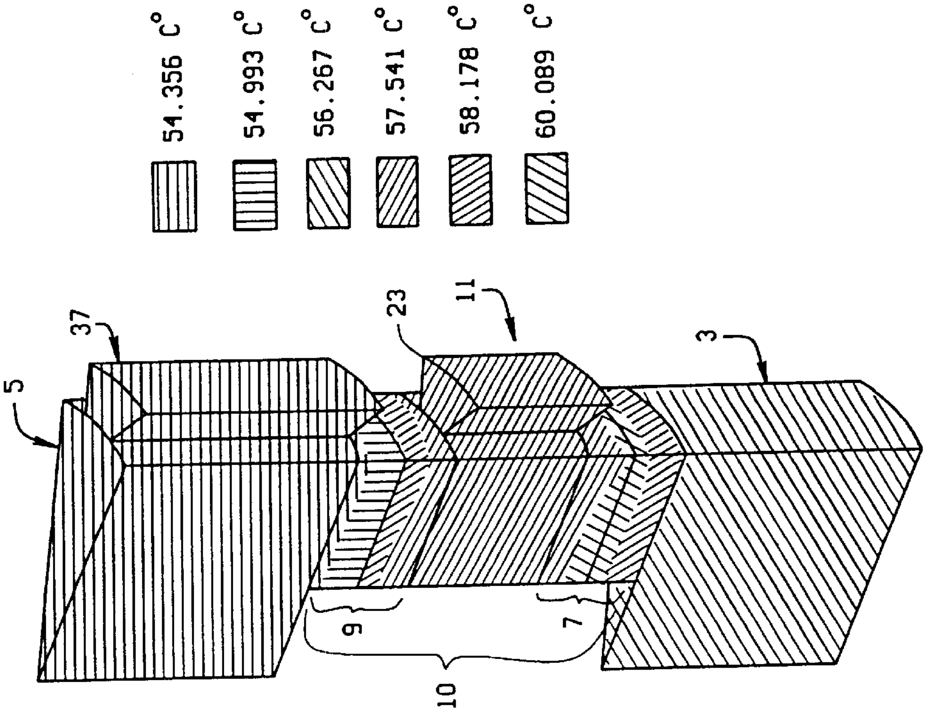
FIG. 5 is a view of the converter, similar to FIG. 4, illustrating the thermal gradients of the components under normal steady state operating conditions.

The number of fins 23 and 37 and the shape of the fins on the front driver of the metal spacer 11 and on the back driver 5 are selected so as to efficiently remove heat from the converter 1 by means of convection and radiant heat transfer. Those skilled in the art will recognize that the number and shape of the fins employed may vary, depending on the size, frequency, and power of the transducer. Because the spacer 11 is positioned between the front and back ceramic stacks, the heat generated during operation of the converter has a shorter path to exit the converter (as compared to a prior art converter C). The spacer 11 (and the back driver mass 5) act as a heat sink, and quickly convect the generated heat to ambient air. As seen in FIG. 5, the temperature of the ceramic stacks 7 and 9, and the spacer 11 is substantially uniform.

Figure 6:
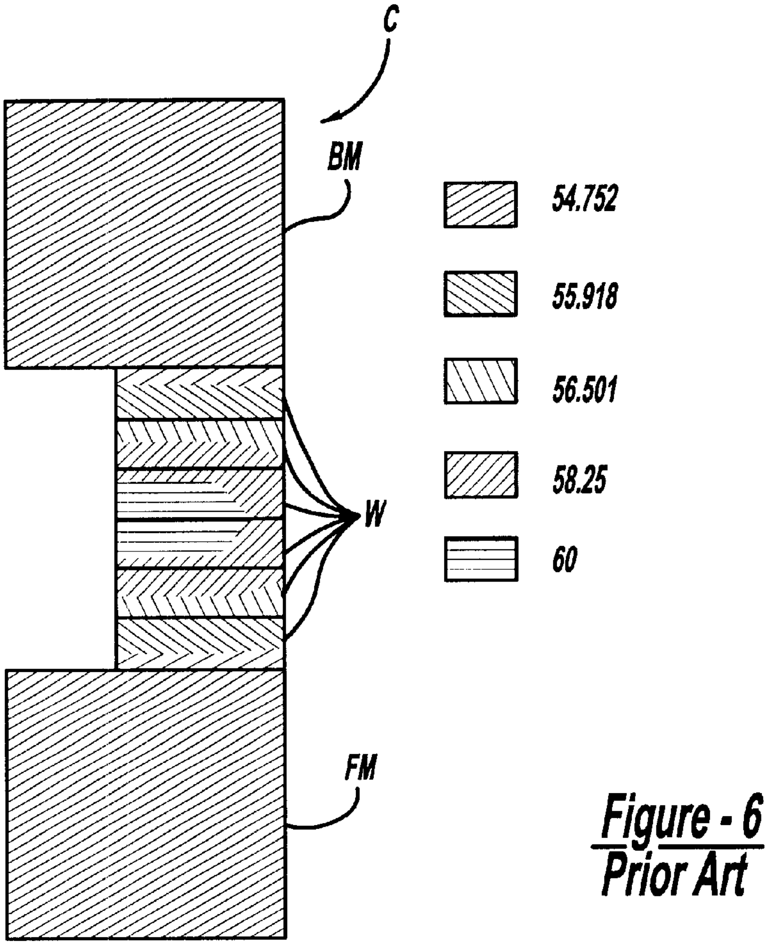
Figure - 6 Prior Art
FIG. 6 is a vertical cross-sectional view of the a prior art converter illustrating the thermal gradients of the components under normal steady state operating conditions.

For example, in a transducer having two of the ceramic wafers W in each stack 7 and 9 with each wafer having a diameter of about 5.6 cm., when operated at 9.7 Watts (11 $W/m^2$ at 25° C.) under steady state conditions, the whole assembly 10 (i.e., the stacks and spacer) is between about 59.5° C. and 60.1° C. There is typically a gradient through the back ceramic stack 9. The wafer adjacent the back driver 5 exhibits a temperature gradient from about 54.4° C. adjacent the back driver mass 5 to a temperature of about 58° C. adjacent the second wafer of the pair. The second wafer exhibits a temperature gradient from about 58° C. adjacent the first wafer of the pair to a temperature of about 59.4° C. adjacent the spacer 11. The temperature characteristics of the converter 1 are much more even than those of comparable prior art converters C, as can be seen when FIGS. 5 and 6 are compared. As seen in FIG. 6, the wafers W of the converter C exhibit a large temperature gradient, with a hot zone in the center of the wafers. At the wafer surfaces adjacent the front and back driver masses FM and BM, the wafers of the prior art converter C are at a temperature of about 54.7° C., and at the center of the ceramic stack, the stack has a temperature of about 60° C. This data is achieved when the converter C is operated at 6.8 Watts (11 $W/m^2$ at 25° C.). Thus, the converter 1 of the present invention can handle greater power than the prior art converter C, and still maintain a substantially more uniform temperature distribution.

As is known, dielectric losses cause heat generation in the ceramics, and the thermal conductivity of the ceramic is a much poorer than it is for metal (aluminum). This poor thermal conductivity results in the temperature gradients exhibited by the prior art converter C, as seen in FIG. 6. When ceramic wafers are lumped together (to increase the power output of the converter), as seen in FIG. 6, a high temperature builds up in the ceramics. This temperature buildup limits the power generating ability of the converter C, and causes parameter changes which lead to less overall stability in the prior art converter. Because the converter 1 of the present invention more efficiently removes the heat generated by wafers, the wafers are cooler than in the prior art converter C, and the converter 1 is able to handle a substantially higher average power than the prior art converter C. Additionally, the higher average power is handled with less ceramic mass than is present in the prior art converter C. The average power which can be handled by the converter 1 is as much as 33% more than the average power which can be handled by the prior art converter C.

Because the wafer/spacer assembly 10 is symmetrical about the lateral axis LA, and because the assembly demonstrates more uniform (and lower) temperatures when the converter is operated, the stresses in the converter are more easily controlled. Consequently, the reflection of the tooling back to the terminals is much more defined and much more stable. Various tooling stacks are also much better defined. Additionally, since the stress in the ceramic wafers is much more uniform, the converter can be made larger in diameter than conventional converters, such as the prior art converter C, and the ceramic volume can be increased. For example, the wafers 15 of the converter 1 have a diameter of about 2.2 in. or 2.6 in., whereas the wafers W of the prior art converter have a diameter of about 2 in. Therefore, the ceramic volume of the converter 1 (with four wafers) approaches the ceramic volume of the prior art converter C having six wafers, as shown in FIG. 6.

As noted above, the vibrations have a vibrational node in the spacer 11, preferably at the lateral axis LA (i.e., at the vertical center of the spacer 11 with reference to FIG. 3). Hence, the ceramics are substantially symmetrical to the vibrational node and spaced from the node vibrational. Thus, the ceramics share more equally in the power generation of the converter 1. The motional voltages are also more equal. This cuts down on circulating currents in the converter, and associated losses due to circulating currents.

Figure 1:
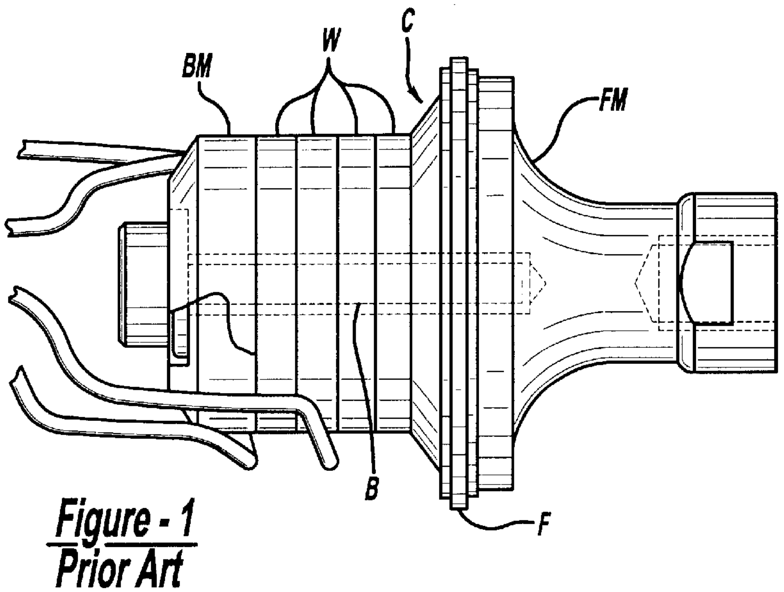
Figure - 1 Prior Art
FIG. 1 is an elevational view of a prior art electroacoustic converter.
Figure 10A:
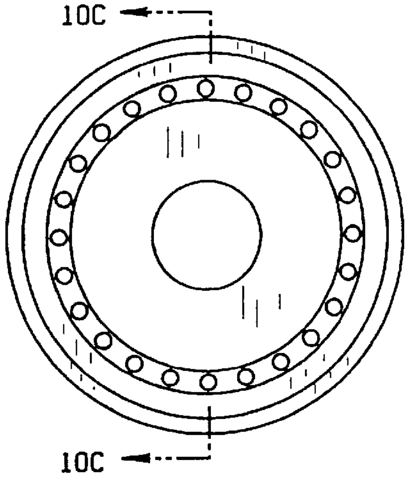
FIGS. 10A–10C illustrate a solid mount for use with a converter of the present invention where the solid mount would aid in the transfer of heat from the converter.
Figure 10B:
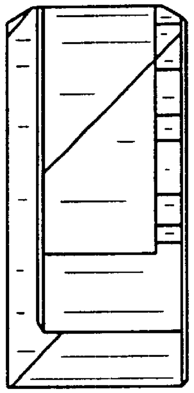
Figure 10C:

It will be understood that the spacer section may be designed to become a solid mount region of the converter, as described in the co-assigned U.S. Pat. Nos. 5,443,240 and 5,590,866, which are herein incorporated by reference. In this way a housing could be installed around the converter. A solid mount "spacer" would provide both a convention and a conduction heat transfer path to the housing. Such an alternative design for a 15 kHz transducer or converter having a solid mount is shown in FIGS. 10A–10C. It will be understood that the solid mount would engage a flange (similar to flange F, as shown in FIG. 1) extending outwardly from spacer 9 so as to mount the converter within a converter housing, as described in the above-noted U.S. Pat. No. 5,590,866.

As various changes could be made in the above constructions without departing from the scope of the invention, it is intended that all matter contained in the above description or shown in the accompanying drawings shall be interpreted as illustrative and not in a limiting sense. For example, the shape and size of the fins could be altered. The spacer 11 could be provided with a mounting flange, if desired. These examples are merely illustrative.

What is claimed is:

1. An electroacoustic converter for converting electrical energy into mechanical vibrations dimensioned to be resonant at a predetermined frequency, said converter having a longitudinal axis and comprising: a metal front driver mass; a metal back driver mass; a front ceramic stack; a back ceramic stack; a metal spacer disposed between said front and back ceramic stacks; a fastener extending axially of said converter and being coupled to said front and back driver masses to clamp said ceramic stacks and said metal spacer between said front and back driver masses; said front and back ceramic stacks being of a suitable piezoelectric ceramic material such that when energized with alternating electrical power said converter is rendered resonant at said predetermined frequency for vibrations of said frequency traveling longitudinally through said converter whereby said metal spacer is disposed substantially in a nodal region of said longitudinal vibrations, and said back driver mass having a finned peripheral surface to increase its surface area exposed to ambient for enhancing the heat transfer therefrom to ambient.

2. The electroacoustic converter of claim 1 wherein said converter is dimensioned to form a half wavelength resonator at said predetermined frequency having a vibration node of the longitudinal vibrations located within said converter.

3. The electroacoustic converter of claim 1 wherein said front and back ceramic stacks each comprise at least one pair of ceramic wafers of said piezoelectric ceramic material with these wafers being substantially similar in size, shape and electrical and mechanical characteristics so as to cause said stacks to be substantially symmetric.

4. The electroacoustic converter of claim 3 wherein said metal spacer disposed comprises a body having a cross-section diameter substantially equal to the cross-sectional diameter of said ceramic stacks and axially disposed fins on an outer surface of said body extending out beyond said ceramic wafers for the convection transfer of heat from said spacer to ambient.

5. The electroacoustic converter of claim 1 wherein said front driver includes a reduced cross-sectional portion so as to increase vibrational amplitude.

6. The electroacoustic converter of claim 1 wherein said front driver has a plurality of fins thereon.

7. The electroacoustic converter of claim 1 wherein said metal spacer is provided with a finned peripheral surface to enhance its heat transfer to ambient.

8. The electroacoustic converter of claim 7 wherein said finned surface comprises a plurality of ribs and groves extending longitudinally along said respective surface substantially parallel to said axis.

9. An electroacoustic converter for converting electrical energy into mechanical vibrations dimensioned to be resonant at a predetermined frequency, said converter having a longitudinal axis and comprising: a metal front driver mass; a metal back driver mass; a front ceramic stack; a back ceramic stack; a metal spacer disposed between said front and back ceramic stacks; and a fastener extending axially of said converter and being coupled to said front and back driver masses to clamp said ceramic stacks and said metal spacer between said front and back driver masses; said front and back ceramic stacks being of a suitable piezoelectric ceramic material such that when energized with alternating electrical power said converter is rendered resonant at said predetermined frequency for vibrations of said frequency traveling longitudinally through said converter whereby said metal spacer is disposed substantially in a nodal region of said longitudinal vibrations, and said back driver mass having a finned peripheral surface to increase its surface area exposed to ambient for enhancing the heat transfer therefrom to ambient; said front and back ceramic stacks each comprise at least one pair of ceramic wafers of said piezoelectric ceramic material with said wafers being substantially similar in size, shape and electrical and mechanical characteristics so as to cause said stacks to be substantially symmetric, wherein said converter is dimensioned to form a half wavelength resonator at said predetermined frequency having a vibration node of the longitudinal vibrations located within said converter.

10. The electroacoustic converter of claim 9 wherein said metal spacer disposed comprises a body having a cross-section diameter substantially equal to the cross-sectional diameter of said ceramic stacks and axially disposed fins on an outer surface of said body extending out beyond said ceramic wafers for the convection transfer of heat from said spacer to ambient.

11. The electroacoustic converter of claim 9 wherein said front driver includes a reduced cross-sectional portion so as to increase vibrational applitude.

12. The electroacoustic converter of claim 9 wherein said front driver has a plurality of fins.

13. The electroacoustic converter of claim 9 wherein said metal spacer is provided with a finned peripheral surface to enhance its heat transfer to ambient.

14. The electroacoustic converter of claim 13 wherein said finned surface comprises a plurality of ribs and grooves extending longitudinally along said respective surface substantially parallel to said axis.

15. An electroacoustic converter for converting electrical energy into mechanical vibrations dimensioned to be resonant at a predetermined frequency, said converter having a longitudinal axis and comprising: a substantially cylindrical metal front driver mass; a substantially cylindrical metal back driver mass; front piezoelectric wafer means; back piezoelectric wafer means; a substantially cylindrical metal spacer disposed between said front and said back wafer means; a fastener extending axially of said converter and being coupled to said front driver mass and said back driver mass for clamping said wafer means and said metal spacer between said front and said back driver masses; said piezoelectric wafer means when energized with alternating current electrical energy of said frequency causing said converter to be resonant at said predetermined frequency for mechanical vibrations of said frequency traveling longitudinally through said converter whereby said metal spacer is disposed substantially in a nodal region of said longitudinal vibrations, and said back driver mass having a finned peripheral surface to increase its surface area exposed to ambient for enhancing the heat transfer therefrom to ambient.

16. The electroacoustic converter of claim 15 wherein said metal spacer is provided with a finned peripheral surface to enhance its heat transfer to ambient.

17. The electroacoustic converter of claim 15 wherein said finned surface comprises a plurality of ribs and grooves extending longitudinally along said respective surface substantially parallel to said axis.

* * * * *

UNITED STATES PATENT AND TRADEMARK OFFICE

CERTIFICATE OF CORRECTION

PATENT NO. : 6,434,244 B1
DATED : August 13, 2002
INVENTOR(S) : Allan J. Roberts et al.

It is certified that error appears in the above-identified patent and that said Letters Patent is hereby corrected as shown below:

Title page,
Item [57], ABSTRACT,
Line 8, “drivers” should be -- driver --.

Column 2,
Line 19, “ceramics” should be -- ceramic --.

Column 4,
Line 36, delete “a” (second occurrence).

Column 6,
Line 61, after “is” delete “a”.

Column 7,
Line 44, “convention” should be -- convection --.

Column 8,
Line 42, “groves” should be -- grooves --.

Column 9,
Line 15, “applitude” should be -- amplitude --.

Signed and Sealed this

Eighth Day of July, 2003

JAMES E. ROGAN
*Director of the United States Patent and Trademark Office*